United States Patent [19]

Nakamura et al.

[11] Patent Number: 4,686,512

[45] Date of Patent: Aug. 11, 1987

[54] INTEGRATED DIGITAL CIRCUIT FOR PROCESSING SPEECH SIGNAL

[75] Inventors: Makoto Nakamura, Kanagawa; Hideo Suzuki, Kawasaki; Toshihiko Kuroki, Tokyo, all of Japan

[73] Assignee: Kabushiki Kaisha Toshiba, Kawasaki, Japan

[21] Appl. No.: 833,252

[22] Filed: Feb. 27, 1986

[30] Foreign Application Priority Data

Mar. 1, 1985 [JP] Japan ................................... 60-40507
Sep. 25, 1985 [JP] Japan ................................. 60-210132

[51] Int. Cl.⁴ ............................................. H03M 7/37
[52] U.S. Cl. ........................ 340/347 DD; 340/347 C; 375/27
[58] Field of Search .................. 340/347 C, 347 DD; 332/11 D; 375/25-33

[56] References Cited

U.S. PATENT DOCUMENTS 4,128,832 12/1978 Betts ........................... 340/347 DD
4,592,070 5/1986 Chow ................................. 375/27
4,646,322 2/1987 Flanagin ............................. 375/27

OTHER PUBLICATIONS

"A Single Chip Processor for CCITT Standard ADPCM CODEC" M. Sato, et al. Feb. 14, 1985; IEEE International Solid State Circuits Conference.

"Overview of the ADPCM Coding Algorithm"; W. R. Daumer et al. Nov. 1984; IEEE Global Telecommunications Conference.

*Primary Examiner*—Charles D. Miller
*Attorney, Agent, or Firm*—Oblon, Fisher, Spivak, McClelland & Maier

[57] ABSTRACT

In an integrated circuit for transcoder, a subtractor generates a signal representing a difference between an input speech signal and a prediction signal. This signal is transferred to a quantizing unit. The unit quantizes an output signal from the subtractor, and generates a predictive encoded signal. An inverse quantizing unit generates a difference signal. A predictor filter generates the prediction signal to be supplied to the subtractor. A signal path changing unit made up of electronic switches responds to a mode select signal to suitably change an electric connection among the subtractor, the quantizing unit and the reverse quantizing unit, whereby the integrataed circuit device can function as an ADPCM encoder or an ADPCM decoder.

6 Claims, 22 Drawing Figures

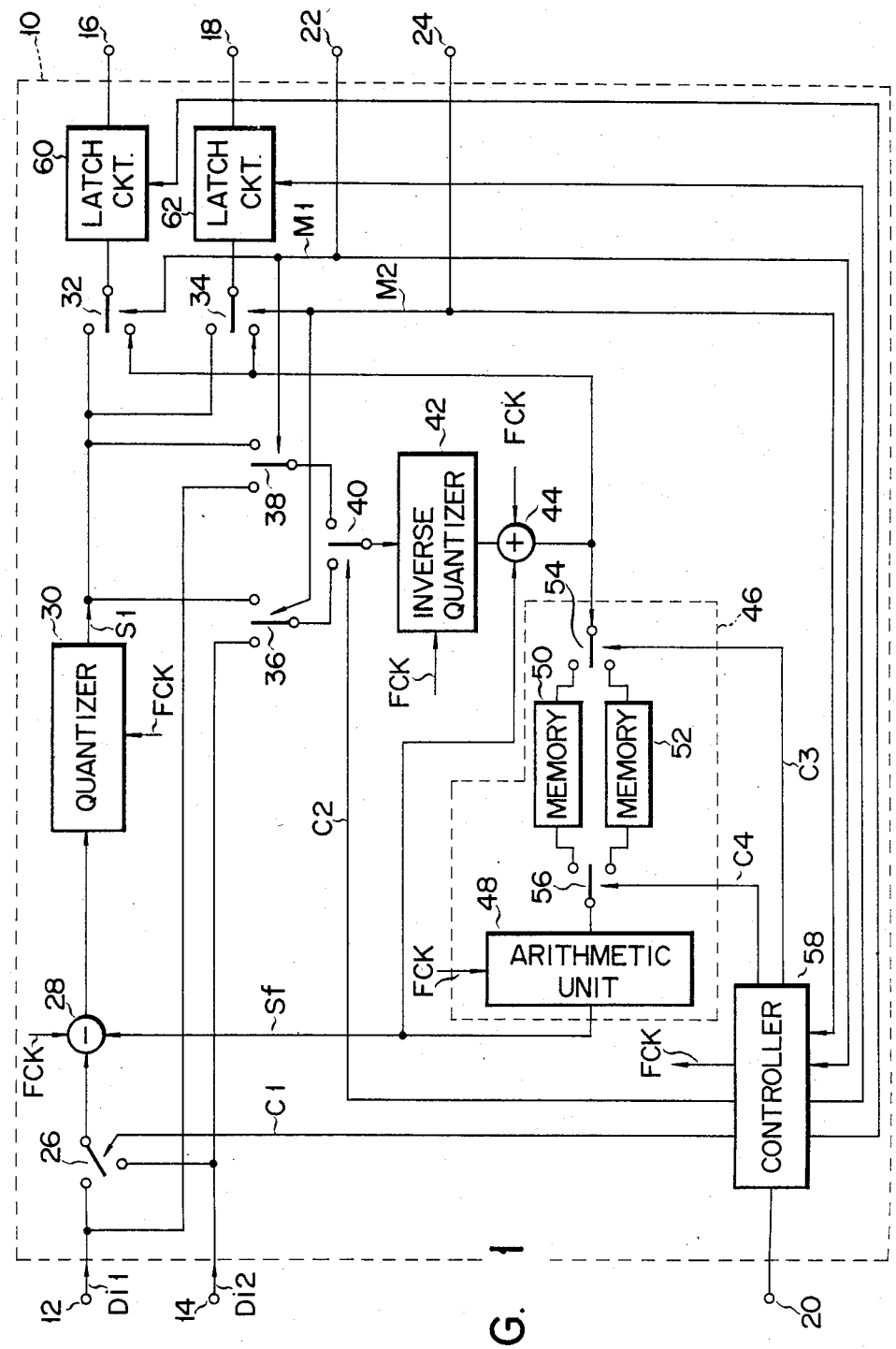
F I G. 1

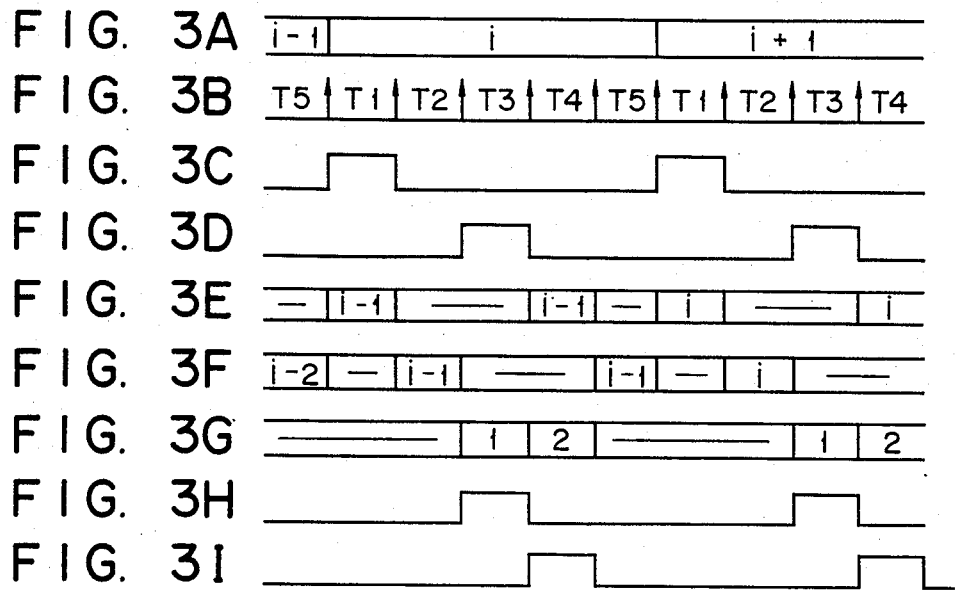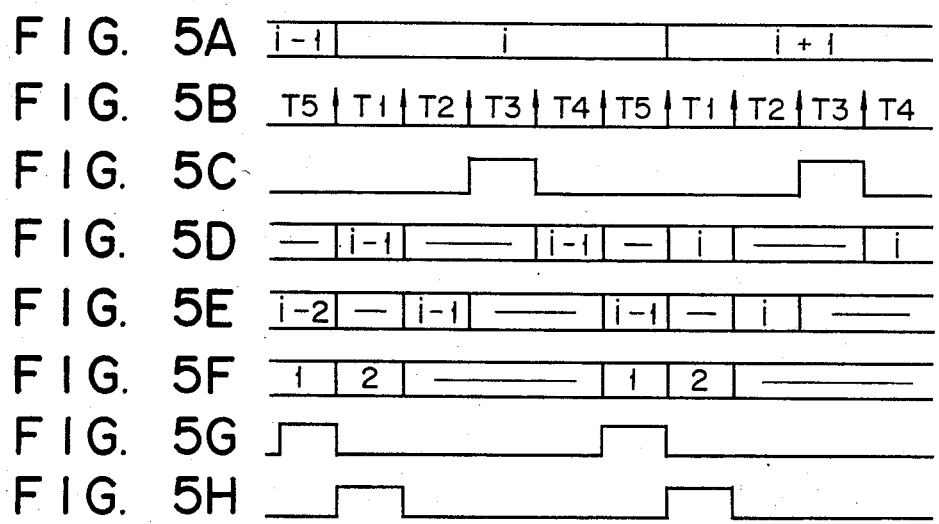

INTEGRATED DIGITAL CIRCUIT FOR PROCESSING SPEECH SIGNAL

BACKGROUND OF THE INVENTION

The present invention relates to a digital communication network, and more particularly to an integrated circuit used for a high efficiency encoding system such as adaptive differential pulse code modulation.

Recently, due to remarkable developments in digital communication networks, it is possible for various types of analog information to be converted into digital form and transferred among subscribers. A communication system using a predictive encoding system such as adaptive differential pulse code modulation (ADPCM) is widely employed at present. The ADPCM system is advantageous in 1) that speech signals in a telephone network, for example, can be compressed to approximately 16 to 32K-bit/s, which is advantageous considering signal transmission, and 2) that the reproduced signal on the receiving side is high quality. Advances in semiconductor device manufacturing technology with higher integration, such as LSIs, further facilitates wider application of ADPCM systems.

Recent digital communication systems have included transcoder units for performing data compression/expansion. A transcoder unit contains an encoding unit which is provided in the transmitting side for converting a PCM signal into a compressed digital signal, and a decoding system which is provided in the receiving side for decoding the compressed digital signal. By the way, the PCM technique has been widely used in digital communication systems. Particularly, a $\mu$-low PCM system or A-low PCM system according to the CCITT recommendation is most popular. When signal processing units, such as the encoding and decoding units, are packed in an LSI chip, it is necessary that the integrated circuit be designed so as to adapt to the above PCM system.

Although the encoding and decoding circuits have many common components, these circuits have been integrated separately and an exclusive encoder LSI and decoder LSI are manufactured independently. Therefore, in the prior art, two types of LSIs are required for the encoder and decoder units. According to an improved example, a circuit arrangement is so designed as to include all the components necessary for the both encoding and decoding circuits and is integrated in an LSI chip. This LSI thus may serve as either an encoder or a decoder. When assembled in the communication system, the LSI is preset so as to perform a selected function, that is, either an encoding or decoding function. In this case, since only one type of LSI can be used as the encoder and decoder units in the communication system, it is possible to reduce the types of LSIs to be manufactured for the encoder and decoder. However, the preset LSI assembled in the system can perform only a selected function, and the function thereof cannot be changed during the system operation. For this reason, the same number of LSIs as the total number of encoder and decoder units, as needed in a digital communication system, must be prepared. Particularly, in the case of a 1:n signal transmission system, such as a telephone conference system wherein one party receives a plurality of speech signals of other parties who are participating in the same conference or meeting, an increased number of LSIs must be used according to the number of signal transmission channels. This causes the configuration of the hardware of the transcoder units included in the digital communication system to be undesirably complicated.

SUMMARY OF THE INVENTION

It is an object of the present invention to provide a new and improved integrated circuit which can be integrated in an LSI chip of decreased size, and can be used effectively for a digital communication system, and hence simplify the circuit arrangement of the system.

The integrated circuit device of this invention is applied for a digital communication system. The integrated circuit device has input terminals and output terminals. An input signal selector is provided for receiving digital input signals supplied through the input termnals. The input signal selector generates selected input signals in a time-division multiplexing manner. A subtractor receives a prediction signal and each of the selected input signals time-divisionally supplied thereto from said signal selector. The subtractor generates a difference signal representing a difference between the prediction signal and each of the selected input signals. A quantizer quantizes the difference signal output from said subtractor and generates a digitally compressed signal, such as an adaptive differential pulse code midulation (ADPCM) signal. An inverse quantizer inverse-quantizes the ADPCM signal to generate an inverse-quantized signal. A predictor filter generates the prediction signal which is to be suplied to the subtractor based on the inverse-quantized signal. A signal path changing unit is provided for receiving a mode select signal, for changing an electrical connection among the subtractor, the quantizer, the inverse quantizer and the output terminals in response to the mode select signal. In a first operation mode, the subtractor, the quantizer and the inverse quantizer are electrically connected with each other in a manner as to constitute an encoder configuration for each of the selected input signals. Under this condition, the input signals are encoded and supplied to the output terminals in a time-division multiplexing manner. In a second operation mode, the subtractor and the quantizer are electrically disconnected so as to form a decoder configuration for each of the selected input signals. Therefore, under this condition, the input signals are decoded and supplied to the output terminals in a time-division multiplexing manner.

BRIEF DESCRIPTION OF THE DRAWINGS

The present invention is best understood by reference to the accompanying drawings, in which:

FIG. 1 is a block diagram illustrating the internal construction of an integrated circuit device for transcoder (used in digital speech communication system based on the ADPCM system) which is one preferred embodiment according to the present invention;

FIGS. 3A to 3I show waveforms of signals as supplied to or generated in the key portions of the IC device of FIG. 1 when it is switched to the encoding circuit;

FIGS. 5A to 5H show waveforms of signals as supplied to or generated in the key portions of the IC device of FIG. 1 when it is switched to the decoding circuit;

DETAILED DESCRIPTION OF THE PREFERRED EMBODIMENTS

Figure 2:
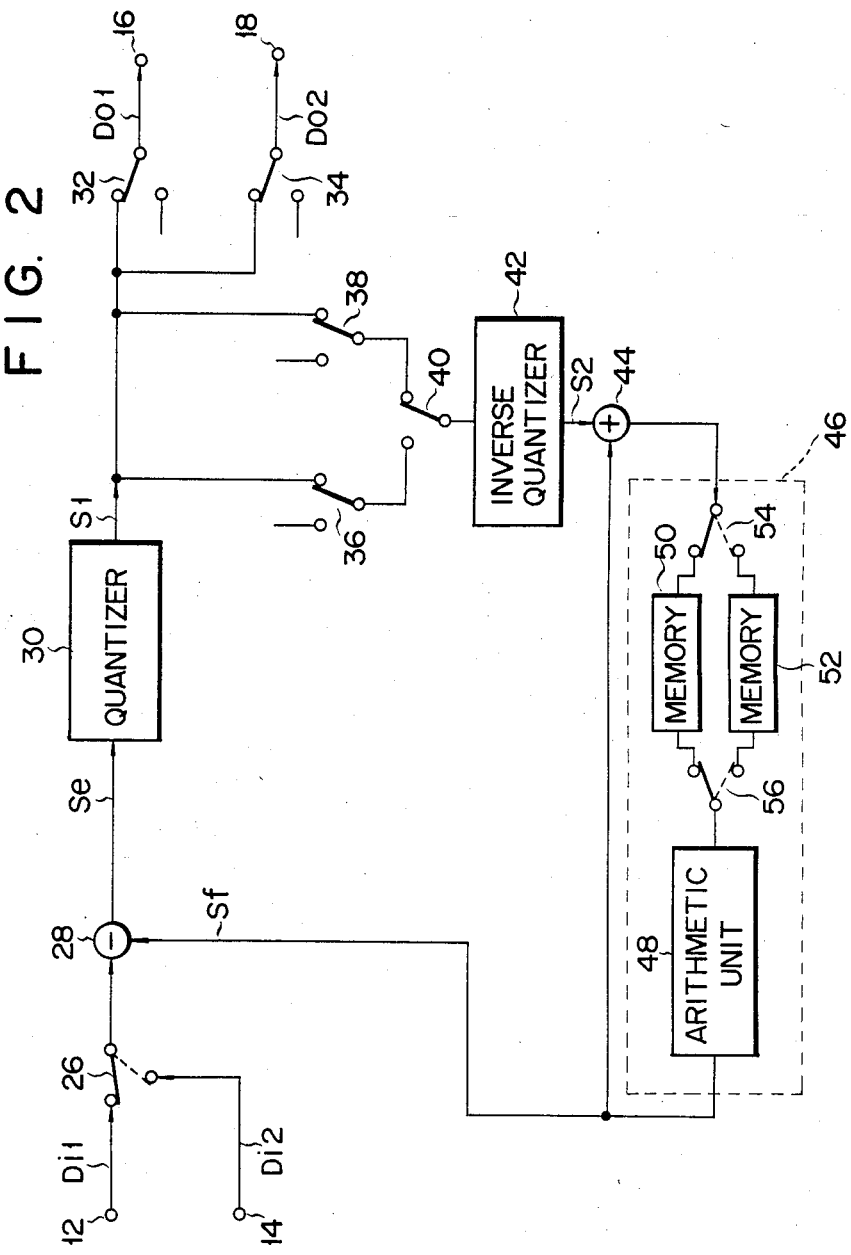
FIG. 2 shows in block form an equivalent circuit of the IC device when it is switched to a encoding circuit.

Referring now to FIG. 1, an integrated circuit (IC) for a speech transcoder, which is one embodiment of the present invention, is indicated by block 10. IC circuit 10 is packed in one chip LSI. Circuit 10 includes two input terminals 12 and 14, two output terminals 16 and 18, one clock input terminal 20, and two mode select terminals 22 and 24. First input terminal 12 is connected through electronic switch 26 to subtractor 28, which is further connected to quantizing circuit 30. Circuit 30 quantizes difference signal output from subtractor 28, and generates ADPCM signal S1 of the predetermined number of bits. Electronic switch 26 has input terminals connected to first and second input terminals 12 and 14. Switch 26 serves to selectively transfer to subtractor 28 signals from input terminals 12 and 14. The output terminal of quantizing circuit 30 is connected to first and second output terminals 16 and 18 by way of mode select switches 32 and 34, as electronic switches connected in parallel with each other, and latch circuits 60 and 62.

The output terminal of circuit 30 is further connected to the inputs of other electronic switches 36 and 38 connected in parallel with each other. Switches 36 and 38 are connected through succeeding stage electronic switch 40 to reverse quantizing circuit 42, which locally decodes the ADPCM signal S1 sent from quantizing circuit 30. Switch 40 has two inputs connected to the outputs of switches 36 and 38, and an output connected to inverse quantizing circuit 42. The output signal of circuit 42 is fed back to subtractor 28, by way of adder 44 and predictor filter 46. The output signal of adder 44 is also fed back to the adder itself, via predictor filter 46. The output signal of adder 44 is further connected to the second inputs of mode select switches 32 and 34 connected to output terminals 16 and 18 of IC circuit 10.

Predictor filter 46 includes arithmetic unit 48 and parallel-connected memories 50 and 52. These memories are each constructed using delay circuits such as digital filter in a known manner. The output signal from adder 44 is supplied to either of memories 50 and 52 by electronic switch 54 provided in predictor 46. The outputs of memories 50 and 52 are connected to unit 48 via another electronic switch 56 in predictor 46. Thus, the output signal from adder 44 is selectively supplied to memories 50 and 52 by means of switches 54 and 56, and processed by unit 48, and then transferred to subtractor 28.

The remaining inputs of switches 36 and 38 located at the output stage of quantizing circuit 30 are respectively connected to input terminals 12 and 14. Input terminal 12 is connected through to quantizing circuit 30 through subtractor 28, as mentioned above, and also to the second input terminal of electronic switch 38. With this connection, switch 38 performs a switching operation, and may selectively transfer either ADPCM signal S1 from quantizing circuit 30 or the signal from first input terminal 12 to the succeeding stage electronic switch 40. Input terminal 14 is connected to electronic switch 26 at the preceding stage of subtractor 28, and directly connected to the second input of switch 36. Accordingly, electronic switch 36 performs a switching operation, and may selectively transfer to the succeeding stage electronic switch 40 either of signal S1 from quantizing circuit 30 or the signal from second input terminal 14.

The two mode select switches 32 and 34 provided in IC circuit 10 respond to the first mode select signal M1 from mode select terminal 22, to perform an appropriate mode select operation. The switching operation of select switches 34 and 36 is controlled by the second mode select signal M2 from mode select terminal 24. In IC circuit 10 is provided controller 58 which generates control signals C1 to C4 for controlling the switching operations of switches 26 and 40, and the switches 54 and 56 contained in predictor 46. Controller 58 also generates control signals for controlling latch circuits 60 and 62 in response to mode select signals M1 and M2. Further, controller 58 responds to clock signal CK as supplied thereto through clock input terminal 20, and generates reference clock signal FCK to be supplied to subtractor 28, quantizing circuit 30, inverse quantizing circuit 42, adder 44, and predictor 46.

According to the IC circuit as the first embodiment of the present invention, when it is assembled into a digital communication system based on the ADPCM system, such as the IC circuit for speech transcoder, responsive to mode select signals M1 and M2 supplied from an external circuit, circuit 10 can time-divisionally be switched to an ADPCM encoder circuit or an ADPCM decoder according to a request occurring in the data transfer operation. Specifically, during a time period that mode select signals M1 and M2 supplied to terminals 22 and 24 of IC circuit 10 are logically high, IC circuit 10 functions as the ADPCM encoder. During another time period that these signals are logically low, that circuit serves as the ADPCM decoder. The function changing operation of this IC circuit will now be described in detail referring to FIGS. 2 to 5.

When mode select signals M1 and M2 are logically high, mode select switches 32 and 34 are switched as shown in FIG. 2. Under this condition of the circuit, the output signal S1 from quantizing circuit 30 is led to the output terminals 16 and 18 of the circuit. At this time, electronic switches 36 and 38 are switched to the first input side under control of controller 58.

When the input signal Di1 to the device takes a form as shown in FIG. 3A, one cycle of the operation of the IC device is so defined as to be divided into five periods T1 to T5 by the reference clock signal FCK. In response to pulsative control signal C1 from controller 58 which is high in logic level during the second period T2, as shown in FIG. 3C, input signal select switch 26 transfers to subtractor 28 the first input signal Di1 supplied from first input terminal 12, during only the first period T1 shown in FIG. 3B. During the other periods (T2 to T5), switch 26 supplies to subtractor 28 the second input signal Di2 supplied from the second input terminal 14. Switch 40 responds to pulsative control signal C2 from controller 58, which is logically high during the third period as shown in FIG. 3D, and during only period T3, guides to inverse quantizing circuit 42 signal S1 as supplied thereto from quantizing circuit 30 through switch 38. During the other periods, switch 40 transfers the input signal Si2 from second input terminal 14 to inverse quantizing circuit 42, through switch 36.

Through the switching operations of switches 26 and 40, the data signal supplied from one input terminal 12 of IC circuit 10, for example, a linear PCM signal D1 representing speech information is led to subtractor 28 by way of switch 26. Subtractor 28 calculates a difference between signal Di1 and prediction signal Sf1 output from predictor 46 (see FIG. 3E), in synchronism with reference clock signal FCK, and generates difference signal Se. This signal Se is transferred to quantizing circuit 30 during the second period T2, which quantizes difference signal Se to generate a digital speech signal S1 of the predetermined number of bits (e.g. 16 bits) as the prediction signal. Synchronized with reference clock signal FCK and during the third period T3, the prediction signal S1 from quantizing circuit 30 is led to output terminal 16 through mode select switch 32, and supplied to latch circuit 60. Control signal C5 from controller 58 has the logic high level when mode select signal M2 is logically high during the third period T3. Latch circuit 60 receives control signal C5 and holds an input signal, i.e., the ADPCM signal, supplied thereto during the third period T3 for one cycle of sampling period. The output signal from latch circuit 60 is sent to exterior by way of the terminals.

At this time, ADPCM signal S1 is supplied to inverse quantizing circuit 42 by way of electronic switches 38 and 40, since during the third period T3, switch 40 has been switched to allow the output of quantizing circuit 30 to the input of inverse quantizing circuit 42. Inverse quantizing circuit 42 locally inverse-quantize this signal S1. Difference signal S2 output from inverse quantizing circuit 42 is added, by adder 44, with signal Sf1 output from predictor 46 during the fourth period T4. The output signal S3 of adder 44 is supplied to predictor 46 as a reconstructed signal representing a new sampling value. At this time, the two switches 54 and 56 provided in predictor filter 46 have been switched as shown in FIG. 2. Accordingly, when supplied to predictor 46, signal S3 is transferred to the first memory 50 in predictor 46. This signal is subjected to digital delay processing by memory 50, and subjected to additional operation by operation circuit 48. In other words, predictor 46 stores the input new sampling value in memory 50, and generates a predicted value signal during the next sampling segment i+1 based on this signal. Accordingly, predictor 46 generates a predicted value signal Sf which predicts the present input signal Di on the basis of the past input sampling value to predictor 46. This new signal Sf is supplied as a prediction signal to subtractor 28 and adder 44 during periods T1 and T4 contained in the next sampling segment i+1. In this way, a sequence of processings of first input signal Di1 applied through first input terminal during the ith segment is completed.

The signal processing of the second input signal Di2 as input to the second input terminal during the ith segment is performed after one cycle of reference clock signal FCK since the signal processing of first input signal Di1. Predictor 46 must independently operate for first and second input signals Di1 and Di2. For this reason, it has two parallel memories 50 and 52. These memories 50 and 52 respectively store a first reconstructed difference signal output from adder 44 during the fifth period T5, and a second reconstructed difference signal output from adder 44 during period T1. (The signal supply to memories 50 and 52 is appropriately changed by the switches 54 and 56 provided in predictive filter 46, as already described.) When second input signal Di2 is processed, in-filter switches 54 and 56 are switched as indicated by broken lines in FIG. 2, to supply the input signal to predictive filter 46 to second memory 52. The second predictive signal generated corresponding to second input signal Di2 is output during periods T2 and T5, as shown in FIG. 3F. As a result, the second output signal Do2 is supplied to latch circuit 62. The level of control signal C6 from controller 58 is changed to the logic high level during the fourth period T4. Latch circuit 62 receives control signal C6 and holds the ADPCM signal supplied thereto for one cycle of sampling period. The output signal from latch circuit 62 is output from second output terminal 18 during period T4, while delaying one cycle from first output signal Do1. Thus, if the signal as obtained during period T3 is taken out of terminal 16, first ADPCM signal Do1 is obtained. If a signal as obtained during period T4 is taken out, second ADPCM signal Do2 is obtained.

Figure 4:
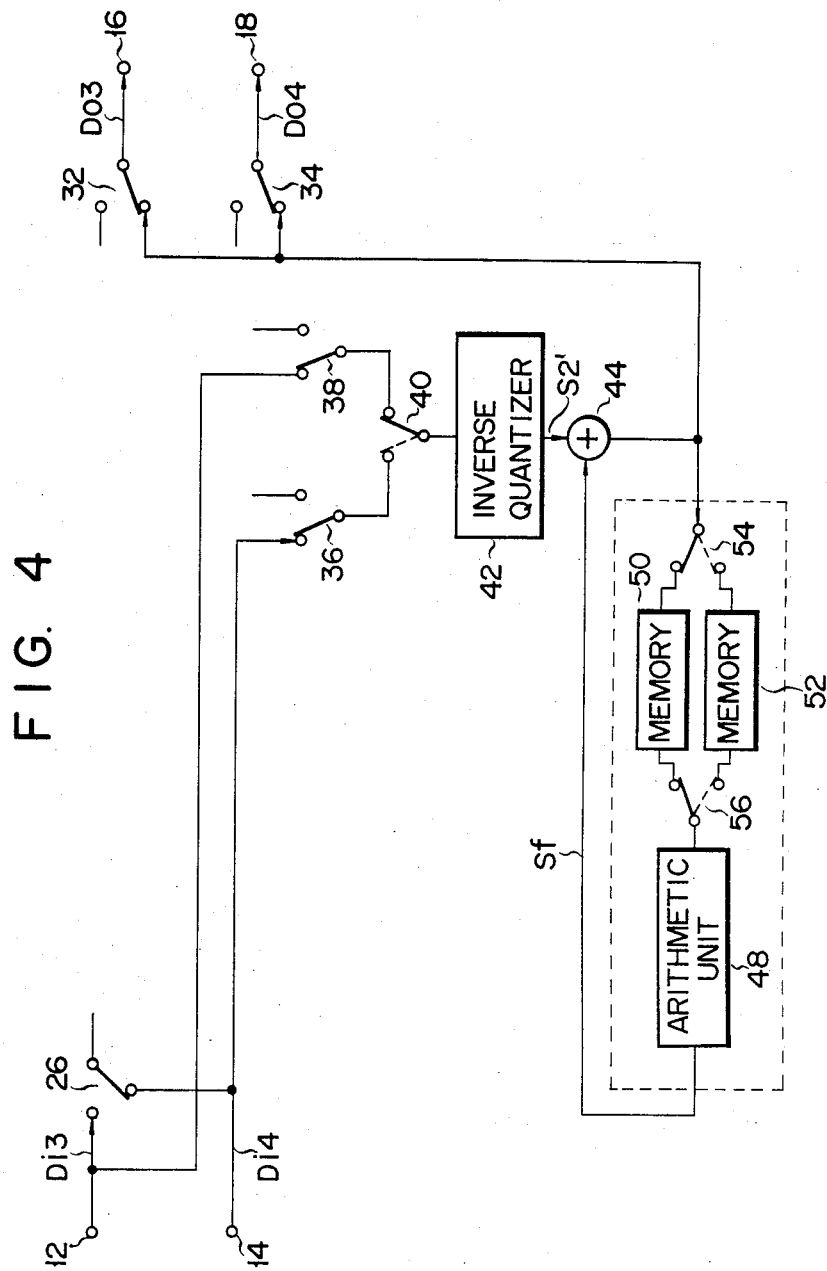
FIG. 4 shows in block form an equivalent circuit of the IC device when it is switched to a decoding circuit.

When mode select signals M1 and M2 have logical low level, mode select switches 32 and 34 are switched as shown in FIG. 4, and guides the output signal S1 from adder 44 to the output terminals 16 and 18 of the circuit under discussion. At this time, electronic switches 26, 36, and 38 are switched to the second input side under control of controller 58. Therefore, subtractor 28 and quantizing circuit 30 are electrically disconnected from other components in the IC circuit.

In this case, the signals applied to the IC circuit device are ADPCM signals Di3 and Di4 with waveforms as shown in FIG. 5A. One cycle of the operation of IC device 10 is segmented into five periods T1 to T5 by reference clock signal FCK. The control signal C2 from controller 58 (see FIG. 1) is logically high during only the period T3, as shown in FIG. 5c. Accordingly, switch 40 is switched during period T3 as shown, so that ADPCM signal Di3 supplied to first input terminal 12 is transferred through electronic switches 38 and 40 to inverse quantizing circuit 42. Circuit 42 inverse-quantizes the input signal during period T3, and supplies a reconstructed difference signal S2' to adder 44 during period T4. Signal S2' is added by adder 44 to prediction signal Sf1 from predictor 46. Signal Sf1 has a waveform as shown in FIG. 5D. It is noted that, since switches 54 and 56 in predictor filter 46 have been switched as indicated by continuous line in FIG. 4, prediction signal Sf1 is generated through the operation of memory 50. The reconstracted signal output from adder 44 is supplied through switch 32 to latch circuit 60 during period T5, while synchronizing with reference clock signal FCK from controller 58 (FIG. 1). Control signal C5 has the logic high level during the fifth period T5 in response to mode select signal M1 with the logic low level. Therefore, signal Do3 output from latch circuit 60 appears the output terminal 16 of the IC device.

The reconstructed signal output from adder 44 is supplied as a new sampling value to predictor 46. Although predictor 46 produces first prediction signal Sf1 during periods T1 and T4, the signal Sf1 produced during period T1 is not used in this case. In this way, the decoding processing is performed for first predictive encoded signal Di3.

After period T3, switch 40 responds to control signal C2, and is switched to the opposite position as indicated by broken line to connected second input terminal 14 with inverse quantizing circuit 42. ADPCM signal Di4 supplied from second input terminal 14 is transferred to inverse quantizing circuit 42 during the first period T1, with a time delay corresponding to one clock pulse behind a time point that ADPCM signal Di3 is supplied. At this time, the switches 54 and 56 in predictive filter 46 are switched to the opposite positions as indicated by broken lines. By second memory 52, second predictive signal Sf2 is supplied to adder 44. Accordingly, in adder 44, the operation similar to the above-mentioned case is performed to generate second reproduced speech signal Do4, as shown in FIG. 5E. This signal Do4 is supplied to latch circuit 62 through switch 34. Control signal C6 supplied to latch circuit 62 has the logic high level during the first period T1 in response to mode select signal M2 with the logic low level. Therefore, latch circuit 62 holds the ADPCM signal supplied thereto in the first period T1. The output signal of latch circuit 62, that is, reproduced signal Do4 is then output to exterior from output terminal 18. Through the above sequence of operations, reproduced signal Do3 is obtained from output terminal 16, while another reproduced signal Do4 is obtained.

According to the above-mentioned embodiment, the input signals supplied to the first and second input terminals 12 and 14 of IC device 10 can be processed independently each other in a time-division multiplexing manner. When the mode select signal M1 input to first mode select terminal 22 has a logic high level, and the mode select signal M2 input to the second mode select terminal 24 has a logic low level, IC device 10 serves as ADPCM encoding circuit for the input signal supplied to first input terminal 12, and as an ADPCM decoding circuit for the input signal to second input terminal 14. On the other hand, when the mode select signal M1 input to first mode select terminal 22 is low in logic level, and the mode select signal M2 input to second mode select terminal 24 is high, IC device 10 serves as an ADPCM decoding circuit for the input signal to first input terminal 12, and as an ADPCM encoding circuit for the input signal to second input terminal 14.

The circuit 10 of the above-mentioned embodiment can independently process two input signals in the time-division multiplexing manner. Specifically, responsive to the mode select signals M1 and M2 applied to mode select terminals 22 and 24, the circuit 10 can select any combination of circuit functions, such as two predictive encoding circuits, two decoders, or an ADPCM encoder circuit and an ADPCM decoder. To realize a transcoder of N channels for input PCM signals into ADPCM signals by using IC 10, the number of ICs shown in FIG. 1 as required is only N/2. With the feature of the time-divisional signal processing of circuit 10, all but the memory included in predictive filter 46 can be used for both the encoding and decoding circuits. Therefore, the number of necessary components may be minimized and the chip size may further be reduced. This can lead to simplification of the transcoder circuit and reduction of cost to manufacture.

Figure 6:
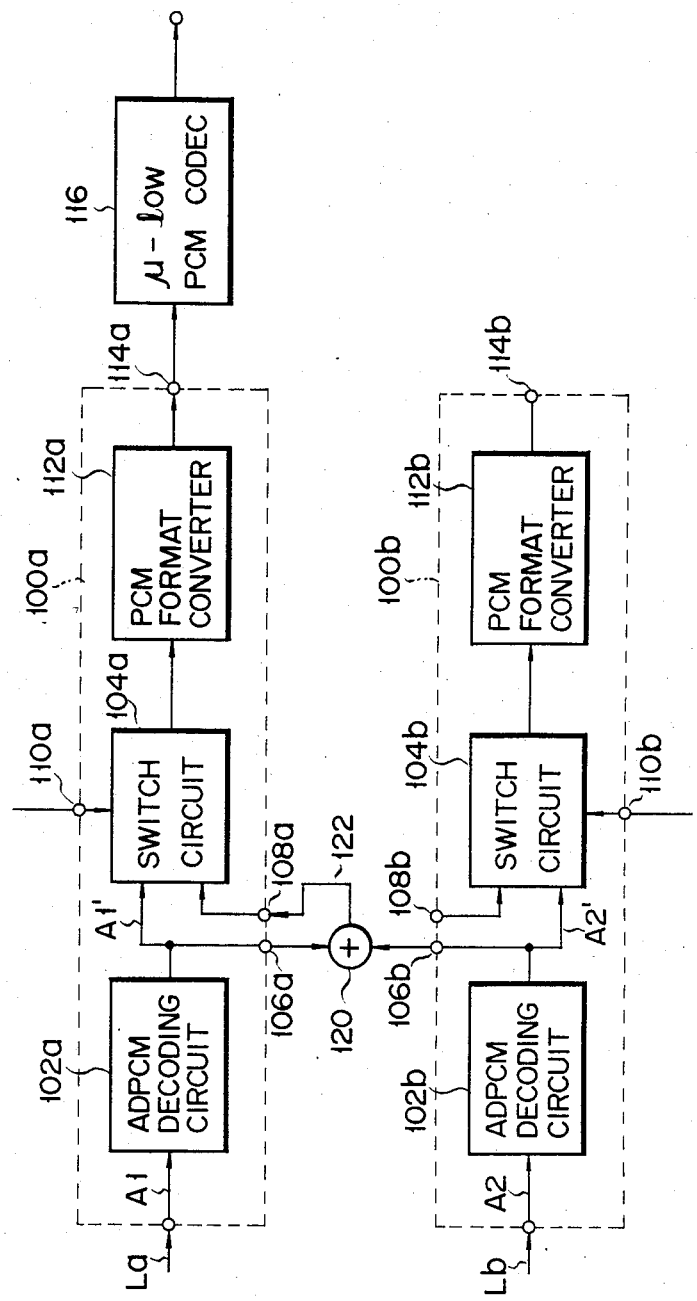
FIG. 6 is a block diagram of a circuit arrangement of an integrated circuit which is a second embodiment of the present invention.

An ADPCM codec LSI applied for 1:n digital data communication in telephone conference system, which is a second embodiment of the present invention, will now be described. An ADPCM codec shown in FIG. 6 is used for an ADPCM decoder circuit in the 1:n data communication system. In this kind of data communication, it is required that the speech signals of a plurality of channels are added together before output. However, it is impossible to simply add the nonlinear PCM signals according to the recommendation by CCITT, such as μ-law PCM signal and A-law PCM signal. It is for this reason that, to convert the nonlinear PCM signals into linear PCM signals, the conventional device required converters equal in number to the channels. The circuit construction of the convention device requiring a number of converters was inevitably complicated. According to the second embodiment of the present invention to be given, there is provided high quality data communication with minimized signal deterioration in the signal transmission, which is realized by a simple circuit construction.

FIG. 6 shows two codec LSIs 100a and 100b to be used as ADPCM decoder unit applied for 1:3 digital data communication, which is used for three-party telephone conference. The input terminals of codec LSIs 100a and 100b are respectively connected to A and B channel lines La and Lb. Nonlinear ADPCM speech signals A1 and A2 are input through channel lines La and Lb to the input terminals of codec LSIs 100a and 100b. Since codec LSIs 100a and 100b have the same constructions, one of them (for example, 100a) will be described. The other LSI 100b will be referred to by merely attaching suffix "b" to the reference symbols of the components corresponding to those of the LSI 100a.

ADPCM codec LSI 100a includes ADPCM decoding circuit 102a. Circuit 102a has an input terminal connected to channel line La. The output terminal of circuit 102a is connected to the first input terminal of switch circuit 104a. The output terminal of circuit 102a is further connected to first external circuit connection terminal 106a of LSI 100a. ADPCM decoding circuit 102a decodes input ADPCM signal A1, and generates linear PCM signal A1'. This linear PCM A1'' is supplied to switch circuit 104a, and also to first external circuit connection terminal 106a. This terminal 106a serves as "linear PCM signal output terminal". LSI 100a includes second external circuit connection terminal 108a. A linear PCM signal is supplied from the external circuit to second external circuit connection terminal 108a. This terminal 108a serves as "linear PCM signal input terminal". Terminal 108a is connected to the second input of switch circuit 104a. Switch circuit 104a performs the switching operation in response to a control signal to be supplied to third external circuit connection terminal 110a of LSI 100a. Through the switching operation, circuit 104a selectively generates a linear PCM signal output from ADPCM decoding circuit 102a or a linear PCM signal input from terminal 108a.

The signal output from switch circuit 104a is supplied to PCM format converter 112a. This converter 112a converts the linear PCM output from switch circuit 104a into a nonlinear PCM speech signal according to the recommendation of CCITT (for example, μ-law PCM signal). Since the output of converter 112a is connected to the output terminal 114a of LSI 100a, the converted μ-low PCM speech signal is output from the output terminal 114a of LSI 100. The μ-low PCM speech signal is supplied to known PCM codec 116 where it is converted into the original analog speech signal.

Major features of the 1:3 digital data communication system constructed with two LSIs 100a and 100b will be described. Adder 120 is connected to linear PCM signal output terminals 106a and 106b of LSIs 100a and 100b. Adder 120 adds linear PCM speech signals supplied through the output terminals 106a and 106b of LSIs 100a and 100b, and supplies the added speech signal (i.e. the result of addition of the speech signals of two channels La and Lb) 122 is applied to linear PCM signal input terminal 108a of LSI 100a. At this time, the switch circuit 104a of LSI 100a has been switched under control of the control signal to allow the signal input to the second input terminal of the switch circuit per se to be transferred to PCM signal converter 112a. Specifically, the speech signals (ADPCM signals) of two parties coming through two channel lines La and Lb are converted into linear PCM signals by decoding circuits 102a and 102b, and then are added together by adder 120. Added signal 122 is supplied to LSI 100a. In the LSI, it is transferred through switch circuit 104a to signal converter 112a where it is converted into the nonlinear PCM speech signal. The nonlinear PCM speech signal is supplied from the output terminal 114a of LSI 100a to PCM codec 118. Therefore, the data as the sum of the speech data of two parties appears at the succeeding stage of PCM codec 118.

The circuit arrangement above mentioned may greatly simplify the system construction, for example, in the three-party telephone system that, to send speech signal from two parties to one party, the speech signals from the two parties must be added together. For example, if linear PCM signal output terminal 106 and linear PCM input terminal 108 are provided in each LSI 100, there is eliminated a need for additionally using for each channel a PCM format converter for converting the μ-low PCM signal from the decoding circuit into the original linear PCM signal. According to the present invention, the circuit unit in the receiving side may be assembled by using the equal number of ADPCM codec LSIs to the number of channels, and one adder. Accordingly, the decoding unit for the telephone meeting communication system, which is simple construction and small in size, may be realized.

Furthermore, the above-mentioned embodiment has another great effect that the quality of the reproduced speech signal can be improved. The above circuit arrangement minimizes distorsion of the reproduced speech signal, to greatly improve the signal to noise ratio. This will be described in detail below.

As described above, in the conventional device, the PCM format converter circuit is additionally used for each decoding circuit of each speech channel. The μ-low PCM signals from the decoding circuits are converted into the original linear PCM signal before these signals are added together. The output signal from the adder is sent to the PCM codec for generating an analog signal after it is further converted into the nonlinear PCM signal by the converting circuit dedicatedly provided for the conversion. Let us consider a case that an increased number of signal converters (for converting the μ-low signal into the linear PCM signal for addition and for converting the linear PCM signal to the μ-low signal for obtaining an analog signal) are provided in the signal path from the addition of speech signals of a plurality of channels to the production of one analog signal. In this case, if generation of the quantizing noise in each converter is not limited, the signal finally produced contains an increased amount of quantizing noise. As a result, the distorted component in the speech signal is increased to remarkably deteriorate the sound quality of the speech.

In the circuit arrangement of the present embodiment as described above, the linear PCM signal generated in ADPCM codec LSI 100 is directly taken out to exterior. The external adder adds (composes) this signal to the linear PCM signal likewise derived from other LSI or LSIs. The added signal is again fed to one LSI. The LSI generates a μ-low PCM signal using the received added signal. This circuit arrangement indicates that the need for signal conversion is minimized. Therefore, mixing the quantizing noise into the speech signal is limited in an extreme. This effect of the present invention is larger, as the number of channels is more increased. Therefore, application of the IC circuit according to the present invention for the multichannel speech communication system would be most effective.

Figure 7:
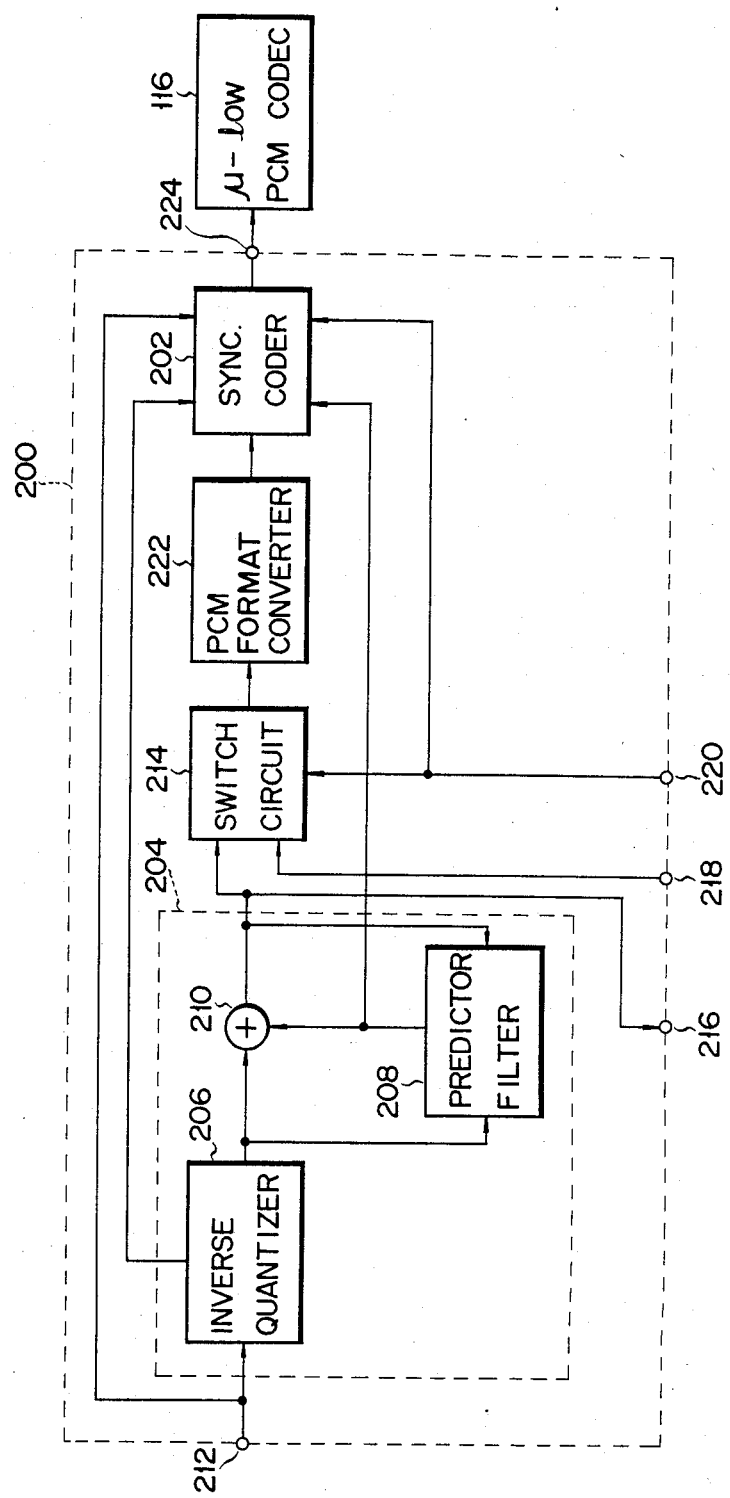
FIG. 7 is a block diagram of a circuit arrangement of an integrated circuit device according to a third embodiment of the present invention.

Finally, a an ADPCM codec LSI which is a third embodiment of the present invention will be described referring to FIG. 7. The ADPCM codec LSI 200 shown in FIG. 7 is used as a predictive encoding circuit in a 1:n data communication system, as in the second embodiment. This LSI 200 is featured by the use of synchronous coding adjustment circuit 202. The μ-low PCM codec unit located at the post stage of ADPCM LSI 200 is like the codec 116 in the FIG. 6 embodiment, and hence it will not be explained merely attaching like reference numeral to its block.

ADPCM codec LSI 200 includes predictive encoding circuit 204. Circuit 204 is made up of inverse quantizing circuit 206, predictor filter 208, and adder 210, as known in the art. The input terminal 212 of LSI 200 is connected to the input of circuit 206. The first output terminal of circuit 206 is connected through adder 210 to the first input of switch circuit 214. The first output of circuit 206 is further connected through predictor 208 to adder 210. With this connection, adder 210 sums a difference signal from inverse quantizing circuit 206 and a predictive signal generated by predictor 208, and produces it as the output signal of circuit 204. A decoded signal from adder 210 is fed back to filter 208, in the form of a new sample signal. Predictive filter 208 generates a new predictive signal using this signal, and feeds it to adder 210.

As in the second embodiment shown in FIG. 6, LSI 200 is provided with linear PCM signal output terminal 216 and linear PCM signal input terminal 218. Since output terminal 216 is connected to the output of circuit 204, the output signal of the adder 210 contained in circuit 204 is transferred not only to switch circuit 214 but also to this terminal 216. Accordingly, if necessary, the linear PCM signal generated by decoding circuit 204 can directly be output from LSI 200 to exterior. Input terminal 218 is connected to the second input of switch circuit 214. With this connection, the linear PCM signal supplied from an external circuit (not shown) to this terminal 218 is directly transferred to the second input of switch circuit 214. Responsive to the control signal applied from the control terminal 220 of LSI 200 to the input terminal, circuit 214 performs the switching operation, to transfer to PCM format converter 222 either of a decoded signal (linear PCM signal) from decoding circuit 204 or a linear PCM signal supplied through terminal 218 from exterior. PCM format converter 222 converts the linear PCM signal into non-linear PCM signal such as μ-low PCM signal, which is then supplied to synchronous coding adjustment circuit 202.

Synchronous coding adjustment circuit 202 is designed according to the recommendation G.721 of CCITT, in order to prevent the speech signal from being distorted when the conversion between the PCM and ADPCM signals is repeated in the digital transmission path. In addition to the μ-low PCM speech signal from PCM signal converter 222 (reproduced speech signal), circuit 202 receives an ADPCM signal supplied to the input terminal 212 of LSI 200, a quantizing factor signal from inverse quantizing circuit 206, a predictive signal from predictive filter 208, and a control signal from terminal 220. Circuit 202 simulates the operation of the ADPCM encoder by using the μ-low PCM speech signal, the quantizing factor signal, and the predictive signal. In response to the control signal, circuit 202 simulates the operation of ADPCM encoder by using the μ-low PCM signal, the quantizing factor signal and the predictive signal. An ADPCM signal predicted as obtained by the ADPCM encoder is compared with an ADPCM signal actually applied to the input terminal 212 of LSI 200. If these signals are coincident with each other, circuit 202 directly transfers to LSI output terminal 224 the μ-low PCM speech signal from PCM signal converter 222. If these signals are not coincident, circuit 202 increments the μ-low PCM speech signal by one unit for compensation, and transfers the compensated one to output terminal 224. (It has been mathematically proved and known among those skilled in the art that when two PCM signals are not coincident, these signals can be made coincident with each other by incrementing the μ-low PCM signal by one unit.) By appropriately compensating the μ-low PCM signal generated by LSI output terminal 224 by circuit 202, the distortion accumulated in the reproduced speech signal is zero, even if the signal conversion is repeated.

In the circuit arrangement as mentioned above, the control terminal of synchronous coding adjustment circuit 202 contained in LSI 200 is directly connected to the control terminal LSI 200 (to which the control signal is supplied from exterior). The execution/stop of the compensating operation of circuit 202 can simply and directly be controlled by the control signal transferred to LSI 200. When this LSI 200 is applied for the three-party telephone conference communication system as described referring to FIG. 6, the speech signals output from the linear PCM signal output terminals (216) of a plurality of LSIs are added together by an external adder (not shown). The result of the addition is input to the input terminal (218) for linear PCM signal of a single LSI. In such a case, there is no need for the signal compensating function of circuit 202 contained in LSI 200. The use of the control signal supplied to the control terminal 220 of LSI 200 in FIG. 7 eliminates the need for that function of circuit 202. Thus, LSI 200 may have a variety of applications. In this respect, the three additional terminals 216, 218 and 220 of LSI 200 are very important.

Although the present invention has been shown and described with reference to particular embodiments, various changes and modifications which are obvious to a person skilled in the art to which the invention pertains are deemed to lie with the scope of the invention.

In the above first embodiment, subtractor 28 and adder 44 may be manufactured using almost same components. Therefore, these may be replaced by an adder/subtractor. In this case, the adder/subtractor is time divisionally operated with slightly different timings for signal processing. If so, the circuit arrangement may be simplified, with reduced chip size containing such circuit.

In the above-mentioned embodiment, the predictor filter 46 is designed so as to receive the output signal from the adder 44, assuming that it serves as a pole filter in the decoder. If it is used as a zero filter, however, predictor filter 46 may be modified so as to receive the output signal from the reverse quantizer. Further, if it is used as both the pole and zero filters, the filter may receive both the signals output from adder 44 and inverse quantizer 30. It is natural, however, that these filters are categorized into the predictive filter for generating a predictive signal.

The predictor filter may have either fixed or variable type coefficient. In the case of the variable type coefficient, the coefficient may separately be sent. Furthermore, the present invention may be realized by software or modified so as to receive a great number of input signals.

What is claimed is:

1. An integrated circuit device which is applied to a digital communication system and has input terminals and output terminals, said device comprising:
   (a) input signal selector means for receiving digital input signals supplied through the input terminals and for generating selected input signals in a time-division multiplexing manner;
   (b) subtractor means for receiving a prediction signal and each of the selected input signals timedivisionally supplied thereto from said signal selector means and for generating a difference signal representing a difference between the prediction signal and each of the selected input signals;
   (c) quantizer means for quantizing the difference signal output from said subtractor means to generate a digitally compressed signal including an adaptive differential pulse code modulation signal;
   (d) inverse quantizer means for inversequantizing the digitally compressed signal to generate an inverse-quantized signal;
   (e) predictor means for generating said prediction signal to be supplied to said subtractor means based on said inverse-quantized signal; and
   (f) signal path changing means for receiving a mode select signal, for changing an electrical connection among said subtractor means, said quantizer means, said inverse quantizer means and said output terminals in response to the mode select signal in such a manner that, in a first operation mode, said subtractor means, said quantizer means and said inverse quantizer means are electrically connected with each other so as to form an encoder configuration for each of the selected input signals wherein the input signals are encoded to be supplied to the output terminals in a time-division multiplexing manner, said signal path changing means causing, in a second operation mode, said subtractor means and said quantizer means to be electrically disconnected so as to form a decoder configuration for each of the selected input signals wherein the input signals are decoded to be supplied to the output terminals in a time-division multiplexing manner.

2. The integrated circuit device according to claim 1, wherein, in the first operation mode, said signal path changing means supplies each of the selected input signals to said subtractor means, and changes an electrical connection among said subtractor means, said quantizer means, and said inverse quantizer means so as to transfer the digitally compressed signal from said quantizer means to said inverse quantizer means, and also to said output terminal, whereby said integrated circuit device serves as an encoding circuit.

3. The integrated circuit device according to claim 2, wherein, in a second operation mode, said signal path changing means prohibits the selected input signals from being transferred to said quantizer means, and directly supplies said input signals to said inverse quantizer means, and changes an electrical connection among said subtractor means, said quantizer means, and said inverse quantizer means so as to transfer output signals, which correspond to the input signals and generated sequentially from said inverse quantizing means, to said predictor means, and also to the output terminals of said integrated circuit device, whereby said integrated circuit device serves as a decoding circuit.

4. The integrated circuit device according to claim 3, wherein said signal path changing means includes a plurality of electronic switches.

5. The integrated circuit device according to claim 4, wherein said integrated circuit has two input terminals and two output terminals, and said predictor means has two memories connected in parallel with each other, said memories being alternately operative in response to the signal supplied to the input terminal.

6. The integrated circuit according to claim 5, wherein said integrated circuit further comprises:

adder means having a first input connected to an output of said inverse quantizer means and a second input to which said prediction signal is supplied, said adder means adding together the inverse-quantized signal and the prediction signal, to generate a signal representing the result of addition which is prohibited from being transferred to the output terminals in the second operation mode.

* * * * *